US006512410B2

(12) United States Patent
Jeong

(10) Patent No.: US 6,512,410 B2
(45) Date of Patent: Jan. 28, 2003

(54) DUAL-LEVEL SUBSTRATE VOLTAGE GENERATOR

(75) Inventor: Jeong-Su Jeong, Ichon-shi (KR)

(73) Assignee: Hynix Semiconductor Inc., Seoul (KR)

( * ) Notice: Subject to any disclaimer, the term of this patent is extended or adjusted under 35 U.S.C. 154(b) by 0 days.

(21) Appl. No.: 09/895,348

(22) Filed: Jun. 29, 2001

(65) Prior Publication Data

US 2002/0000868 A1 Jan. 3, 2002

(30) Foreign Application Priority Data

Jun. 30, 2000 (KR) ........................................... 00-36959

(51) Int. Cl.[7] .................................................. H03K 3/01
(52) U.S. Cl. ...................................................... 327/534
(58) Field of Search ................................ 327/530, 534, 327/535, 537, 538, 540, 541, 543, 545, 546

(56) References Cited

U.S. PATENT DOCUMENTS 6,008,690 A * 12/1999 Takeshima et al. ......... 327/534
6,081,459 A * 6/2000 Kim ........................... 327/530

* cited by examiner

*Primary Examiner*—Jeffrey Zweizig
(74) *Attorney, Agent, or Firm*—Townsend and Townsend and Crew LLP

(57) ABSTRACT

A dual-level substrate voltage generator for generating a second voltage with a level higher than that of a first voltage and maintaining the level of the first voltage quickly and stably, thereby reducing sudden current dissipation during an active or pre-charge mode is disclosed. The dual-level substrate voltage generator includes a first substrate voltage generation block and a first voltage detecting block are used to provide the first substrate voltage at an optimum level. A second voltage generating block having a level lower than that of the first substrate voltage and a second voltage detecting block are used to provide the second substrate voltage at the optimum level to the second voltage generating block. A switching block divides a charge between the first and second substrate voltages.

12 Claims, 5 Drawing Sheets

DUAL-LEVEL SUBSTRATE VOLTAGE GENERATOR

CROSS-REFERENCES TO RELATED APPLICATIONS

This application claims priority from a Korean Application, entitled "Dual Level Substrate Voltage Generator" Application No. 2000-36959, Republic of Korea, and filed on Jun. 30, 2000 and incorporates by reference its disclosure for all purposes.

BACKGROUND OF THE INVENTION

1. Field of the Invention

The present invention relates to a dual-level substrate voltage generator, and, more particularly, to a dual-level substrate voltage generator that stably controls a substrate voltage when a current is suddenly flowed (i.e., surges) into a substrate power supply in a negative wordline structure, or during the activation of a chip.

2. Description of the Prior Art

In general, a substrate bias voltage Vbb is applied to a P-well surrounding an NMOS transistor. Vbb is hereinafter referred to as a "substrate bias" since the voltage Vbb is applied to a p-type silicon substrate typically used as a DRAM substrate. The Vbb voltage is provided by an internal substrate bias circuit (e.g., on-chip) that generates a voltage of approximately −2V to 3V from a power supply with Vcc=5V.

Vbb voltage is applied to the power supply circuit to prohibit a loss or latch-up of data in a memory cell by preventing a PN junction within a memory chip from being forward-biased. That is, even if a voltage undershoot of −2V is received in an input waveform of a signal fed to a data input terminal, the PN diode fails to turn on, thus preventing electrons from the input terminal from flowing into the p-type silicon substrate.

Applying substrate bias voltage Vbb to the power supply circuit also decreases the change in threshold voltage of the MOS transistor due to a back-gate effect or a body effect stabilizes the operation of the chip.

It is essential that a substrate bias voltage Vbb is applied to the memory cell region, because as transistors scale to higher densities, and an increase in the density of substrate and well concentrations per unit area produce an increase in fluctuation in threshold voltage to the substrate bias voltage Vbb (i.e., a bulk effect).

As mentioned above, substrate bias voltage Vbb functions as a power supply which prevents a loss or latch-up of data in the memory cell, and in turn increases the threshold voltage of the MOS transistor. This decreases fluctuations in the threshold voltage of the MOS transistor, thereby stabilizing the operation of the circuit.

Referring to the drawings, FIGS. 1 and 2, are respectively a schematic block diagram and an illustration of the generation and feedback process of substrate bias voltage Vbb in the prior art.

As shown in FIG. 1, substrate voltage generation block 1 is a driver for pumping a voltage to generate a substrate voltage Vbb. Substrate voltage detection block 2 senses a level of substrate voltage Vbb fed from substrate voltage generation block 1 and outputs a substrate voltage control signal which is used to initiate an output to substrate voltage generation block 1 for generating a specific level (i.e., targeted level) of Vbb. In hit operation, a power-up of a device renders the substrate voltage control signal to a logic high, allowing substrate voltage generation block 1 to generate Vbb. If the level of Vbb corresponds to the specific level, substrate voltage detection block 2 will detect the targeted level and outputs the substrate voltage control signal as a logic low, stopping the pumping operation of substrate voltage generation block 1.

When the Vbb level is increased during operation in either an active mode, a pre-charge mode, or any other current consuming mode, substrate voltage detection block 2 outputs the substrate voltage control signal to voltage generation block 1 with a logic high value. As a result, substrate voltage generation block 1 is enabled to compensate for the increased Vbb level.

FIG. 2 shows a waveform chart of the Vbb level during, for example, an active or pre-charge mode. When the Vbb level is logic high or logic low, the Vbb level has sharp fluctuations. However, when a considerable current is suddenly dissipated during the operation of the chip, i.e., in active or pre-charge mode, the conventional substrate voltage generator performs a pumping operation to control the Vbb level, thereby compensating for the sudden change in current. Accordingly, a conventional circuit suffers from drawbacks in that it results in delayed response time and overpumping, and causes a sudden fluctuation in voltage level, which makes it difficult to control the substrate voltage level, thus adversely affecting the overall operation of a chip.

SUMMARY OF THE INVENTION

The present invention provides a dual-level substrate voltage generator capable of maintaining a level of the substrate voltage quickly and stably by generating a second substrate voltage having a level lower than that of a first substrate voltage and dividing the charge, to thereby reduce sudden current dissipation during an active or precharge mode.

In accordance with a preferred embodiment of the present invention, there is provided a dual-level substrate voltage generator comprising a first voltage generating means for generating a first substrate voltage; a first voltage detecting means for detecting the level of the first substrate voltage fed from the first voltage generating means, the detecting means outputting a first substrate voltage control signal, which is used to initiate output of the first substrate voltage at an optimum level, a second voltage generating means for generating a second substrate voltage with a level lower than that of the first substrate voltage, a second voltage detecting means for detecting the level of the second substrate voltage fed from the second voltage generating means, the second detecting means outputting a second substrate voltage control signal, which initiates the output of the second substrate voltage to the second voltage generating means at an optimum level, and a switching means for performing a switching operation during a current consuming mode, such as an active or pre-charge mode. The switching means functions to divide the charge on between the first and second substrate voltages, such that charge is shared or exchanged to compensate for fluctuations in the first substrate voltage.

BRIEF DESCRIPTION OF THE DRAWINGS

The above and other features of the present invention will become apparent from the following description of the specific embodiments given in conjunction with the accompanying drawings, in which.

DETAILED DESCRIPTION OF THE SPECIFIC EMBODIMENTS

Figure 2:
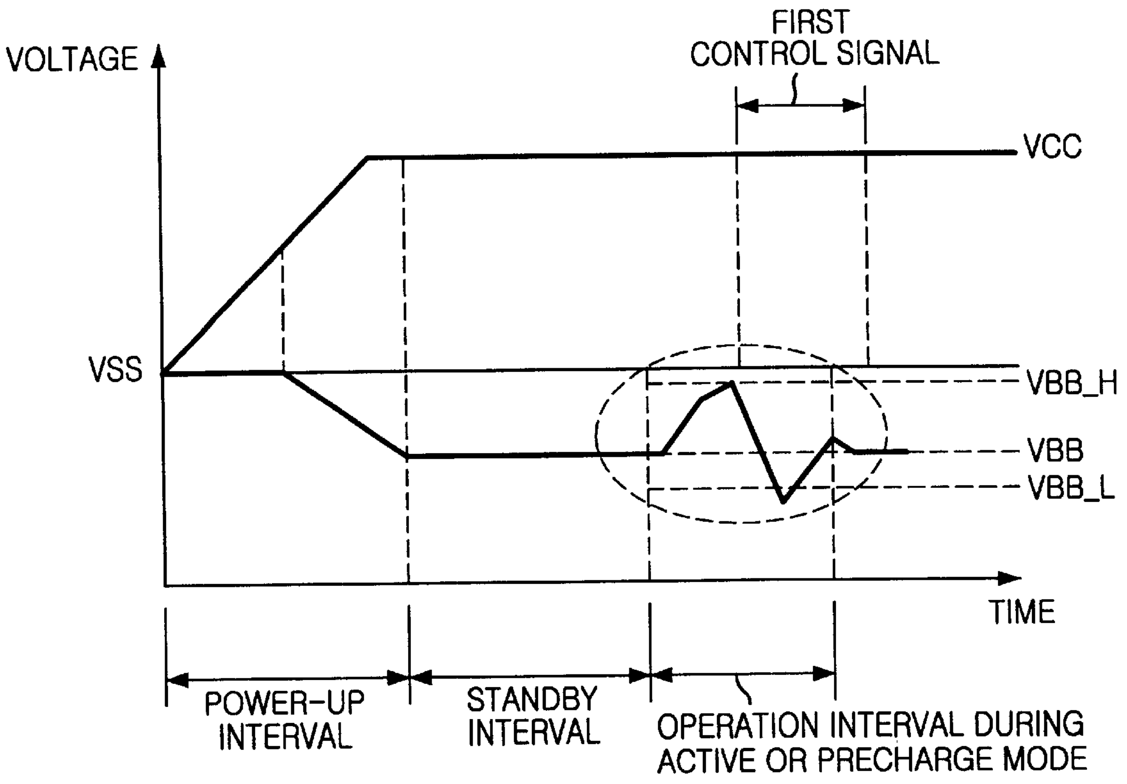
FIG. 2 (PRIOR ART)
FIG. 2 shows a waveform chart of a level of substrate voltage Vbb during an active or pre-charge mode of the conventional substrate voltage generator of FIG. 1.
Figure 3:
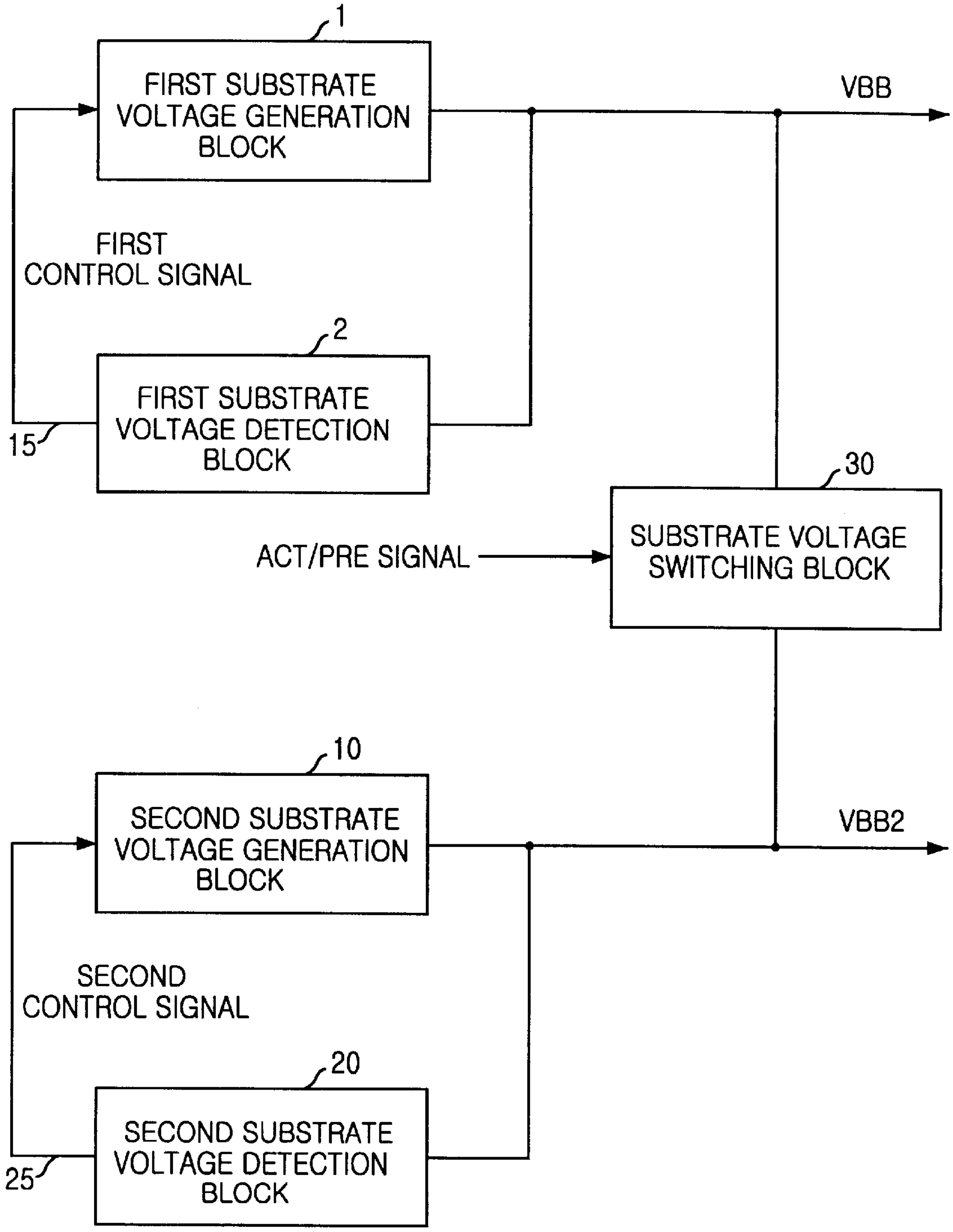
FIG. 3 is a block diagram of a dual-level substrate voltage generator in accordance with a specific embodiment of the present invention.
Figure 4:
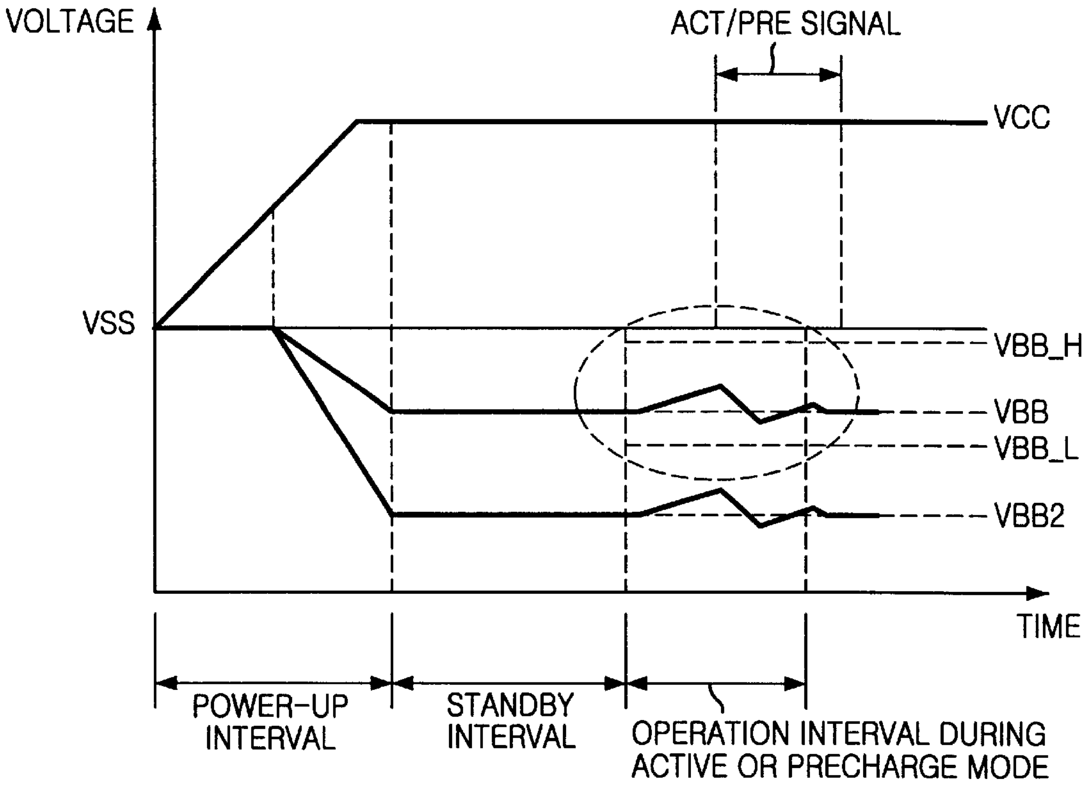
FIG. 4 shows a waveform chart of the levels of two substrate voltages during an active or pre-charge mode.

Referring to the drawings, FIGS. 3 and 4 show a block diagram of a dual-level substrate voltage generator and a waveform chart of signals outputted therefrom in accordance with specific embodiments of the present invention. It should be noted that like parts appearing in FIGS. 1 and 2 are represented by related reference numerals, in some cases.

Figure 1:
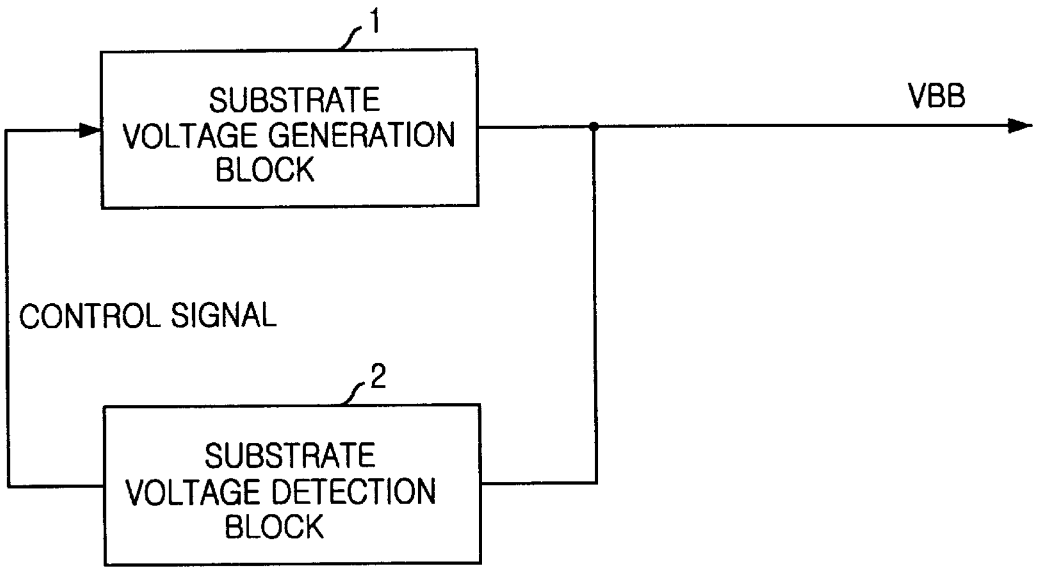
FIG. 1 (PRIOR ART)
FIG. 1 is a block diagram of a conventional substrate voltage generator.

The substrate voltage generator of the present invention shown in FIG. 3 is substantially similar to the substrate voltage generator previously described in conjunction with FIG. 1, except that a second substrate voltage generation block 10, a second substrate voltage detection block 20 and a substrate voltage switching block 30 are also included.

Second substrate voltage generation block 10 generates a second substrate voltage Vbb2 having a level lower than that of a first substrate voltage Vbb. Second substrate voltage detection block 20 detects the level of second substrate voltage Vbb2 fed from second substrate voltage generation block 10 and outputs a second substrate voltage control signal 25, which initiates the output of second substrate voltage Vbb2 to the second substrate voltage generation block 10 at an optimum level. Substrate voltage switching block receives first and second substrate voltages Vbb and Vbb2 from first and second substrate voltage generation blocks 1 and 10, respectively, to divide a charge based on an active/precharge signal ("ACT/PRE") fed thereto.

Next, the operation of the substrate voltage generator of the present invention is described with reference to FIG. 4. During power-up, the first substrate voltage control signal 15 is rendered logic high, allowing first substrate voltage generation block 1 to generate first substrate voltage Vbb to first substrate voltage detection block 2. First substrate voltage detection block 2 detects whether or not the level of the generated Vbb meets the optimum level; and, if so, outputs the first substrate voltage control signal 15 with a logic low value, for example, to stop the pumping operation of first substrate voltage generation block 1.

Simultaneously, second substrate voltage generation block 10 generates second substrate voltage Vbb2. During the power-up, the second substrate voltage control signal 25 is rendered logic high, allowing second substrate voltage generation block 10 to generate second substrate voltage Vbb2 to second substrate voltage detection block 20.

Second substrate voltage detection block 20 detects whether or not the level of the generated Vbb2 meets to the optimum level; and, if so, outputs the second substrate voltage control signal 25 with a logic low value, for example, to stop the pumping operation of second substrate voltage generation block 10.

FIG. 4 is a waveform chart of voltage during an active or pre-charge mode. An Act/Pre control signal is applied to substrate voltage switching block 30, which is rendered logic high during the active mode or the pre-charge mode. Specifically, in response to the Act/Pre control signal, substrate voltage switching block 30 becomes operable between first substrate voltage generation block 1 and second substrate voltage generation block 10. A switching operation by substrate voltage switching block 30, divides the charge using first substrate voltage Vbb from first substrate voltage generation block 1 and second substrate voltage Vbb2 from second substrate voltage generation block 10, thereby allowing second X substrate voltage Vbb2 to compensate for the sudden dissipation of first substrate voltage Vbb.

Figure 5:
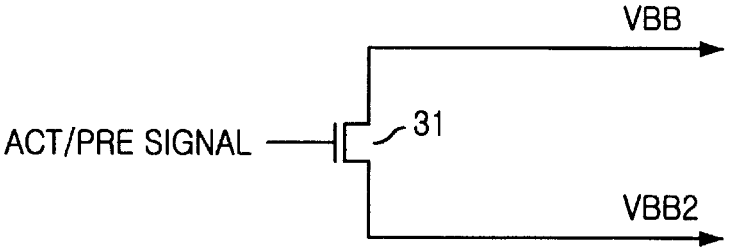
FIG. 5 is an explanatory diagram of the substrate voltage switching block shown in FIG. 3 according to one embodiment.

FIG. 5 is an explanatory diagram of substrate voltage switching block 30 according to an embodiment of the present invention. Referring to FIG. 5, exemplary substrate voltage switching block 30 may be implemented with an NMOS transistor 31, for example. First substrate voltage Vbb outputted from first substrate voltage generation block 1 is coupled to the drain of NMOS transistor 31. Second substrate voltage Vbb2 outputted from the second substrate voltage generation block 10 is coupled to the source of NMOS transistor 31. The Act/Pre control signal is coupled to the gate of NMOS transistor 31. The body of NMOS transistor 31 is grounded.

In operation, when the Act/Pre control signal is inputted to the gate of NMOS transistor 31, switch block 30 is configured to divide (e.g., to exchange) the charge division between the first and second substrate voltages Vbb and Vbb2, which results in a reduced bounce in the Vbb. For example, if Vbb is greater than an optimum voltage level (e.g., excess charge), then when ACT/PRE is active, then the excess charge will flow from Vbb into Vbb2. Conversely, if Vbb is less than an optimum voltage level (e.g., less charge), then when ACT/PRE is active, then charge will flow from Vbb2 into Vbb.

Figure 6:
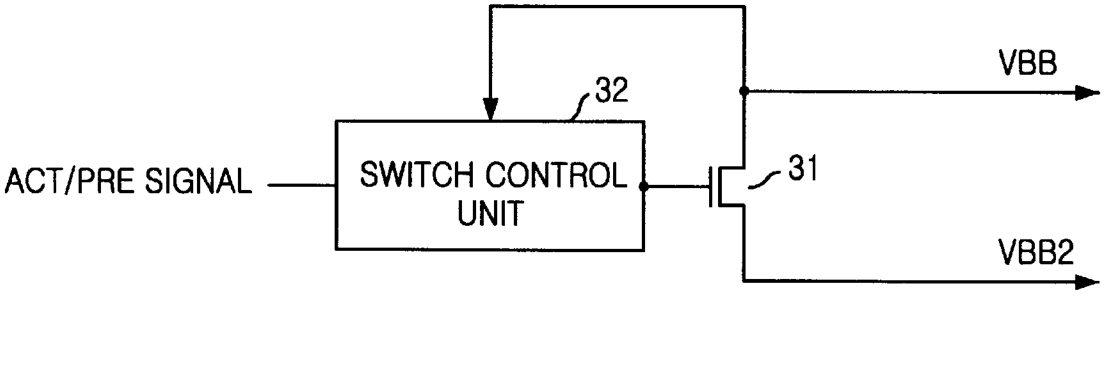
FIG. 6 is another explanatory diagram of the substrate voltage switching block shown in FIG. 3 according to another embodiment.

FIG. 6 is another explanatory diagram of the substrate voltage switching block 30 shown in FIG. 3. As shown in FIG. 6, substrate voltage switching block 30 according to another embodiment includes NMOS transistor 31, for example, and a switch control block 32. First substrate voltage Vbb outputted from first substrate voltage generation block 1 is coupled to the drain of NMOS transistor 31. Second substrate voltage Vbb2 outputted from second substrate voltage generation block 10 is coupled to the source of NMOS transistor 31. The Act/Pre control signal is coupled to an input terminal of switch control block 32 and to the gate of NMOS transistor 31 through switch control block 32. The body of NMOS transistor 31 is grounded.

Substrate voltage switching block 30 as configured as shown in FIG. 6, operates as follows. When the Act/Pre control signal is rendered logic high, switch control block 32 outputs the Act/Pre control signal to the gate of the NMOS transistor 31. In response to the logic high Act/Pre control signal, NMOS transistor 31 is turned on to divide the charge between first and second substrate voltages Vbb and Vbb2. Further, switch control block 32 receives first substrate voltage Vbb from first substrate voltage generation block 1 and detects the level of received voltage, outputting the Act/Pre control signal, which initiates the output of an optimum level of substrate voltage. That is, substrate voltage switching block 30 detects first substrate voltage Vbb fed from first substrate voltage generation on block 1, and controls the charge division, if the Vbb level suddenly drops. In addition, switch control block 32 determines whether the Vbb level is at a higher or lower level compared to the optimum level; and controls NMOS transistor 31 according to that determination, thereby establishing the interval during which the NMOS transistor is turned on.

The present invention compensates for an increase in current level by using a second substrate voltage to allow a first substrate voltage to be maintained at a predefined level, resulting in reduced over-pumping, which, in turn, decreases the bounce problem and provides chip operation with a high degree of reliability.

Although the specific embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A dual-level substrate voltage generator, comprising:

a first voltage generating means for generating a first substrate voltage;

a first voltage detecting means for detecting a level of the first substrate voltage fed thereto from the first voltage generating means, and outputting a first substrate voltage control signal, which is used in providing the first substrate voltage at an optimum level;

a second voltage generating means for generating a second substrate voltage having a level lower than that of the first substrate voltage;

a second voltage detecting means for detecting a level of the second substrate voltage fed thereto from the second voltage generating means, and outputting a second substrate voltage control signal, which is used in providing the second substrate voltage at the optimum level, to the second voltage generating means; and a switching means for performing a switching operation to divide a charge between the first and second substrate voltages.

2. The generator of claim 1, wherein the switching means operates during an active or a pre-charge mode.

3. The generator of claim 2, wherein the switching means includes an NMOS transistor having a drain coupled to the first substrate voltage, a source coupled to the second substrate voltage and a gate configured to receive an enable signal, wherein the enable signal occurs during the active or the pre-charge mode.

4. The generator of claim 1, wherein the switching means includes:

a switch control means for detecting the level of the first substrate voltage and generating a level control signal, which is used in to provide the first substrate voltage at the optimum level, wherein the level control signal is outputted based on an enable signal; and an NMOS transistor having a drain coupled to the first substrate voltage, a source coupled to the second substrate voltage and a gate configured to receive a level control signal of the switch control means.

5. A dual-level voltage generator, comprising:

a first voltage generating means for generating a first substrate voltage; and a second voltage generating means for generating a second substrate voltage in order to maintain the first substrate voltage to an optimum level by compensating dissipation or increase of the first substrate voltage when the first substrate voltage is higher or lower than the optimum level during an active or a pre-charge mode.

6. The generator of claim 5, further comprising a switching means for performing a switching operation to divide a charge between the first and the second substrate voltages.

7. The generator of claim 5, further comprising a first voltage detecting means for detecting a level of the first substrate voltage fed thereto from the first voltage generating means, and outputting a first substrate voltage control signal to the first voltage generating means.

8. The generator of claim 6, further comprising a first voltage detecting means for detecting a level of the firs substrate voltage fed thereto from the first voltage generating means, and outputting a first substrate voltage control signal to the first voltage generating means.

9. The generator of claim 7, further comprising a second voltage detecting means for detecting a level of the second substrate voltage fed thereto from the second voltage generating means, and outputting a second substrate voltage control signal to the second voltage generating means.

10. The generator of claim 8, further comprising a second voltage detecting means for detecting a level of the second substrate voltage fed thereto from the second voltage generating means, and outputting a second substrate voltage control signal to the second voltage generating means.

11. The generator of claim 6, wherein the switching means includes an NMOS transistor having a drain coupled to the first substrate voltage, a source coupled to the second substrate voltage and a gate configured to received an enable signal, wherein the enable signal occurs during the active or the pre-charge mode.

12. The generator of claim 6, wherein the switching means includes:

a switch control means for controlling a level of the first substrate voltage by detecting a level of the first substrate voltage and generating a level control signal, which is used in to provide the first substrate voltage at the optimum level, wherein the level control signal is outputted based on an enable signal; and an NMOS transistor having a drain coupled to the first substrate voltage, a source coupled to the second substrate voltage and a gate configured to receive a level control signal of the switch control means.

* * * * *